(12) United States Patent
Roohparvar et al.

(10) Patent No.: US 6,469,932 B2
(45) Date of Patent: Oct. 22, 2002

(54) MEMORY WITH ROW REDUNDANCY

(75) Inventors: Frankie F. Roohparvar, Milpitas; Fred Jaffin, San Jose; Abrahim Abedifard, Sunnyvale, all of CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/804,125

(22) Filed: Mar. 12, 2001

(65) Prior Publication Data

US 2002/0126529 A1 Sep. 12, 2002

(51) Int. Cl.[7] .............................................. G11C 16/06
(52) U.S. Cl. .................... 365/185.09; 365/200; 365/236
(58) Field of Search ........................... 365/185.09, 200, 365/236

(56) References Cited

U.S. PATENT DOCUMENTS

| 5,237,535 | A | * | 8/1993 | Mielke et al. | 365/185.12 |
| 5,327,383 | A | * | 7/1994 | Merchant et al. | 365/185.09 |
| 5,377,147 | A | * | 12/1994 | Merchant et al. | 365/185.09 |
| 6,034,891 | A | | 3/2000 | Norman | |
| 6,077,211 | A | | 6/2000 | Vo | |
| 6,134,143 | A | | 10/2000 | Norman | |

* cited by examiner

Primary Examiner—Huan Hoang
(74) Attorney, Agent, or Firm—Fogg Slifer Polglaze Leffert & Jay, P.A.

(57) ABSTRACT

A flash memory device incorporating redundant rows. The memory device includes a memory array, control circuitry and a register. The control circuitry controls operations to the memory array. The register stores an address of a defect in the memory array and data indicating a type of defect associated with the address. The control circuitry increments row addresses during an erase operation based on the type of defect stored in the register.

37 Claims, 6 Drawing Sheets

MEMORY WITH ROW REDUNDANCY

TECHNICAL FIELD OF THE INVENTION

The present invention relates generally to memory devices and in particular the present invention relates to a memory with row redundancy and its operation.

BACKGROUND OF THE INVENTION

Memory devices are typically provided as internal storage areas in a computer. One type of memory used to store data in a computer is random access memory (RAM). RAM is typically used as main memory in a computer environment. Most RAM is volatile. That is, RAM generally requires a steady flow of electricity to maintain its contents. As soon as the power is turned off, all data stored in the RAM is lost.

Another type of memory is a non-volatile memory. A non-volatile memory is a type of memory that retains stored data when power is turned off. A flash memory is a type of non-volatile memory. An important feature of a flash memory is that it can be erased in blocks instead of one byte at a time. Each block of memory in a memory array of the flash memory comprises rows and columns of memory cells. Many modern computers have their basic I/O system (BIOS) stored on flash memory chips.

As with other memory devices, defects can occur during the manufacture of a flash memory array having rows and columns of memory cells. Typical defects can include bad memory cells, open circuits, shorts between a pair of rows and shorts between a row and column. Shorts typically occur because of the large number of rows and columns of memory cells that have to be placed in close proximity to each other on an integrated circuit. Defects can reduce the yield of the flash memory device. A way to resolve this problem, without discarding the memory device, is to incorporate redundant elements in the memory that selectively replace defective elements. For example, redundant rows are a common form of redundant elements used in flash memory to replace a defective primary row. Redundant columns are another common form of redundant elements used in flash memory to replace a defective primary column.

After a memory die has been manufactured, it is tested for defects. Generally with volatile memory, redundancy circuitry is used to selectively route access requests directed to the defected elements to the redundant elements. Redundancy circuitry can comprise electrical fuses that are selectively "blown" (i.e. open circuited) to disconnect the shorted rows. The redundant rows are then activated to replace the shorted rows. The electrical fuses are generally blown by one of two methods. The first is known as the Ohm heating method. This method involves driving a substantial current through a fuse to melt the fuse's conductive material. The other method is known as the laser method. The laser method uses a laser to cut a fuse's conductive material. Anti-fuse circuitry can also be used. Anti-fuses are normally open and short-circuited (closed) when programmed.

Some memory devices, including some flash memory devices, utilize non-volatile registers to store addresses of primary elements that are designated to be replaced. The addresses of the primary elements are stored in the registers by the manufacturer. The registers are generally coupled to a redundant circuit. The redundant circuit compares address requests to addresses stored in the registers. If an address request matches an address stored in a register, the redundant circuit directs or maps the access request to the redundant row instead of the shorted row.

Generally, the use of redundant elements work well, however, problems can occur if the defect involves shorts between two rows or shorts between a row and a column in the primary array. This is because, even though a redundant row or column is read to or written to instead of the shorted row or column, the short is still embedded in the primary memory array and the defect can effect other elements in the primary memory array. One problem generally arises during pre-program and soft program cycles of an erase operation. An erase operation is an algorithm that typically comprises a pre-programmed cycle, an erase cycle and a soft program cycle. The pre-programmed cycle of an erase operation puts each memory cell in a programmed state by applying a program pulse to each row of memory cells. The soft program cycle or heal cycle corrects any over-erased memory cells after the erase cycle has been completed by applying a soft program pulse to the over-erased memory cells.

Disabling the redundancy circuit during the pre-program and soft program cycle when a row or column is addressed that is shorted to another row is one method of dealing with this problem. This allows the pre-program and soft program cycle to be applied to the shorted rows and columns in the primary memory array. By doing this, the effect of the shorts on other elements in the primary memory array is eliminated or at least minimized.

However, a problem arises when dealing with a row to row short. When a first row is addressed that is shorted to a second row and a pre-program pulse of a preprogram cycle is applied or a soft program pulse of a soft program cycle is applied, the second row also receives the respective pre-program pulse or soft program pulse. This creates a conflict between a driver of the first shorted row and the driver of the second shorted row that could lead to a collapse of the voltage supply that is driving the rows. If this were to happen, the memory cells in the first and second rows may not get properly programmed. A method of dealing with this problem is by activating the first row and the second row and simultaneously applying the respective pre-program cycle or soft program cycle to the rows. This in turn, creates another problem when the address is incremented after the respective pre-program cycle or soft program cycle has been completed because the next address will be the second shorted row. A way to skip over the second row is needed or another pre-program cycle or soft program cycle will be applied to the first and second shorted rows. This could potentially place too much charge on the memory cells of the rows.

For the reasons stated above, and for other reasons stated below which will become apparent to those skilled in the art upon reading and understanding the present specification, there is a need in the art for a flash memory that has the ability to reduce exposure of programming voltages to rows shorted together.

SUMMARY OF THE INVENTION

The above-mentioned problems with memory devices and other problems are addressed by the present invention and will be understood by reading and studying the following specification.

In one embodiment, a flash memory device includes a memory array, a state machine and a defect register. The state machine is used to control operations to the memory array. The defect register is used to store data indicating a type of defect. The state machine then increments row addresses during an erase operation based on the type of defect stored in the defect register.

In another embodiment, a flash memory device includes a memory array having memory cells arranged in rows and columns, control circuitry, at least one register and a logic circuit. The control circuitry is used to control memory operations. The at least one register is used to store an error code. The logic circuit selectively signals the state machine when a register is accessed during an erase operation that has an error code that indicates a row to row short. Thereafter, the state machine increments row addresses such that only one of two rows shorted together is addressed during a program cycle.

In another embodiment, a flash memory device includes a memory array, a state machine and a logic circuit. The memory array has primary columns and primary rows of memory cells. The memory array further has redundant rows. The state machine controls memory operations. The logic circuit signals the state machine when a row in the primary array is addressed during a program cycle of an erase operation that is shorted to another row in the primary array. Thereafter, the state machine increments row addresses such that only one of the two rows shorted together is addressed during the program cycle.

In another embodiment, a flash memory device includes a memory array, a redundancy circuit, a logic circuit and control circuitry. The memory array has memory cells arranged in primary rows and primary columns. The memory array further has multiple redundant rows that are used to selectively replace defective primary rows. A register is used for each redundant row to store an address of an associated defective primary row and an error code that indicates a type of defect in the associated defective primary row. The redundancy circuit is used to compare address requests to addresses stored in the registers and to decode the error codes. The redundancy circuit redirects address requests from defective primary rows to the redundant rows when an address request matches an address in a register. The logic circuit is coupled to the redundancy circuit and is used to generate a signal in response to an error code in a register that indicates a primary row shorted to another primary row has been addressed. The control circuitry is used to control memory operations to the memory array. When the control circuitry receives the signal from the logic circuit, the control circuitry disables the redundancy circuit during a pre-program or soft program cycle of an erase operation. The control circuitry further activates the primary rows shorted together and applies the respective pre-program or soft program cycle to the rows simultaneously and then increments the row address past the addresses of the shorted primary rows.

In another embodiment, a flash memory device includes a memory array, at least one redundant element, a register, a redundancy circuit, a state machine and a logic circuit. The memory array has a primary array of memory cells arranged in rows and columns. The at least one redundant element is used to selectively replace an associated defective element in the primary array. Each redundant element is used to store an address of the associated defective element and an error code that indicates the type of defect in the defective element. The redundancy circuit compares address requests with addresses stored in the registers and to decode the error code in the associated register. The redundancy circuit redirects address requests from the defective element to the redundant element when an address is matched. A state machine is used to control memory operations. The state machine disables the redundancy circuit during a program cycle of an erase operation when the redundancy circuit matches an address request to an address in a register and the error code in the register indicates a row to row short. The logic circuit is coupled to the redundancy circuit and is used to supply a signal to the state machine in response to an error code indicating a row to row short. The state machine increments row addresses such that only one of two rows shorted together is addressed during a program cycle in response to receiving the signal from the logic circuit.

In another embodiment, a flash memory system includes a processor to provide data, a memory array arranged in rows and columns to store the data, at least one redundant row, a register for each redundant row, a redundancy circuit, a logic circuit and control circuitry. The at least one redundant row is used to selectively replace an associated defective row in the memory array. Each register is used to store an address of an associated defective row in the memory array and an error code that indicates the type of error the redundant row is used to correct. The redundancy circuit is used to compare row address requests to redundancy row addresses and redirect address requests from the defective row to the redundant row. The logic circuit to generate a signal when the redundancy circuit matches an address request to an address in a register during a program cycle and the error code in the register indicates a row has been addressed that has a row to row short. The control circuitry is used to control memory operations. The control circuitry disables the redundancy circuit from redirecting address requests when the signal is received from the logic circuit. The control circuitry further directs an address counter to increment the row address past the rows shorted together upon completion of the program cycle on the rows shorted together.

A method of operating a flash memory system comprises performing a program cycle on a memory array having memory cells arranged in rows and columns, signaling a state machine when a row shorted to another row has been addressed, activating rows shorted together, applying program pulses to memory cells coupled to the shorted rows simultaneously and incrementing a row address beyond the rows shorted together upon completion of the program cycle on the shorted rows.

Another method of operating a flash memory system comprises performing a program cycle on a memory array having memory cells arranged in rows and columns, signaling a state machine when a row shorted to another row has been addressed, activating rows shorted together, applying program pulses to memory cells coupled to the shorted rows simultaneously and incrementing a row address beyond the rows shorted together upon completion of the program cycle on the shorted rows.

Another method of operating a memory system comprises performing a pre-program or soft program cycle on a memory array, producing a signal that is recognized by a state machine when a row is addressed that is shorted to another row, applying the respective pre-program or soft program cycle on the rows shorted together simultaneously and incrementing the row address so that the respective pre-program or soft program cycle is only applied once simultaneously to the rows shorted together.

A method of operating a flash memory during a pre-program cycle comprises applying a pre-program pulse to rows in a memory array incrementally until a row address matches an address in a register and an error code in the register indicates the row at that address is shorted to another row, activating the rows shorted together, applying a pre-program pulse to memory cells coupled to the rows shorted together simultaneously as the columns are incremented, incrementing the row address past the rows shorted together and applying a pre-program pulse to remaining rows in the memory array incrementally.

A method of operating a flash memory during a soft-program cycle comprises monitoring each column for a current level that would indicate a memory cell is coupled to the column that is over-erased, when a column is discovered that has a current level that would indicate an over-erased cell is coupled to the column, applying a soft program pulse to rows coupled to the column incrementally until the current level no longer indicates an over-erased memory cell is coupled to the column or a row address matches an address in a register and an error code in the register indicates the row is shorted to another row, when a row is address that is shorted to another row, activating the shorted rows, applying a soft program pulse to cells coupled to the rows shorted together simultaneously, verifying if a current level in the column still indicates a memory cell is coupled to the column, when a current level still indicates a memory cell is coupled to the column, incrementing the row address past the rows shorted together and applying a soft program pulse to remaining rows in the memory array until the current level no longer indicates an over-erased memory cell is coupled to the column.

Another method of operating a flash memory system comprises applying a program cycle to rows in a memory array incrementally until a row address matches a redundancy row address stored in a register, reading an error code in the register indicating the row addressed is shorted to another row, disabling the redundancy circuit from redirecting the address request to a redundancy row, activating the current row and the following row simultaneously, applying the program cycle to the shorted rows simultaneously, sending an enable signal from a redundancy circuit to a logic circuit indicating the error code was row to row short, sending a jump row signal from the logic circuit to a state machine during the program cycle on the shorted rows, incrementing the row address beyond the shorted rows, wherein the state machine increments the row address based on the jump row signal sent by the logic circuit after the program cycle has been completed on the shorted rows and applying the program cycle to remaining rows in the memory array incrementally.

A method of operating a flash memory system having a memory array with a row N shorted to a row N+1 comprises performing a pre-program or heal program cycle of an erase operation on rows of the memory array incrementally, addressing row N, signaling a state machine that row N is shorted to row N+1, activating row N and row N+1, applying a pre-program or heal program cycle to row N and row N+1 simultaneously, incrementing the row address twice after the pre-program or heal program cycle has been completed on row N and row N+1 and before the pre-program or heal program cycle is applied on a following row and performing a pre-program or heal program cycle of an erase operation on the remaining rows of the memory array incrementally.

A method of operating a memory system having a memory array with a row (row N) shorted to another row (row N+1) during a pre-program or soft program cycle comprises addressing row N, reading an error code stored in a register that indicates row N is shorted to row N+1 with a redundancy circuit, disabling the redundancy circuit from pointing the address request from row N to a redundant row, activating row N and row N+1, performing the pre-program or soft program cycle on row N and row N+1 at the same time and incrementing an address counter to row N+2.

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
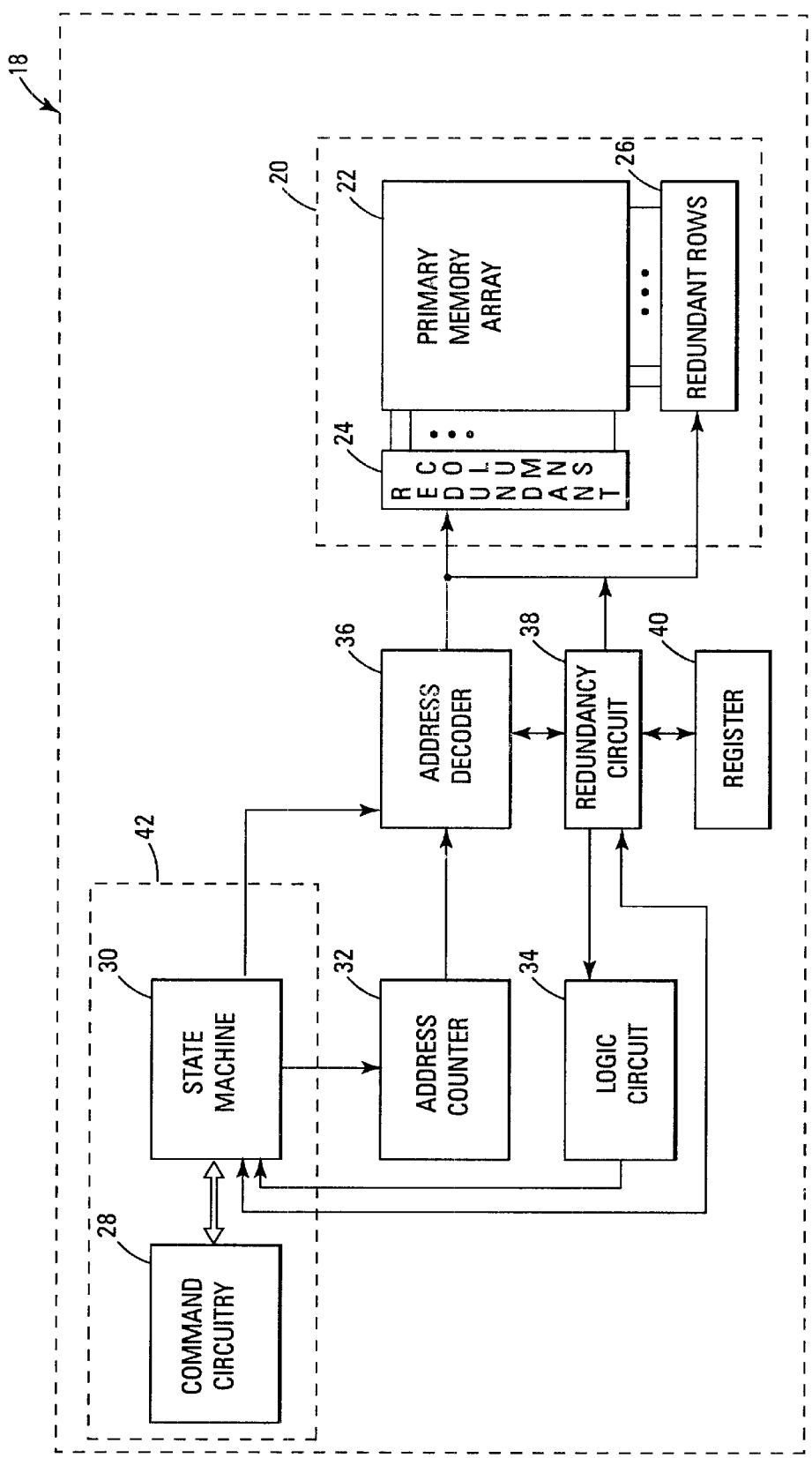
FIG. 1 is a block diagram illustrating one embodiment of the present invention.

In the present invention, a signal is sent to an address counter directing the address counter to increment a row address after a pre-program cycle or soft program cycle (program cycle) has been applied simultaneously to a pair of rows shorted together. This ensures that the cells of the shorted rows only receive the program cycle one. FIG. 1 is a simplified illustration of a flash memory device 18 of the present invention. As illustrated, the present invention includes a memory array 20. The memory array 20 is illustrated as having a primary memory array 22, redundant columns 24 and redundant rows 26. The redundant columns 24 and redundant rows 26 are mapped into the primary array 22 to replace defective columns and rows in the primary array 22.

Command circuitry 28 is provided to control the basic operations of the memory device 18. A state machine 30 is also provided to control specific operations performed on the memory array and cells. The command circuitry 28 and/or state machine 30 can be generally referred to as control circuitry 42. The control circuitry 42 controls read, write, erase and other memory operations. The memory device 18 further has an address counter 32 to increment an address of the memory array 20. The state machine 30 or control circuitry 42 directs operations of the address counter 32.

The memory device further has an address decoder 36 coupled to the state machine 30 and the address counter 32. In addition, a redundancy circuit 38 is coupled to the address decoder 38. The redundancy circuit 38 compares address requests to addresses stored in a defect register 40 or register 40. The addresses stored in the register 40 represent addresses of defective primary rows or columns. When the redundancy circuit finds a match, it redirects the address request from the defective row or column in the primary memory array 22 to the respective replacement redundant row or column. An external processor can be coupled to the control circuitry 42 to provide external information.

Figure 2:
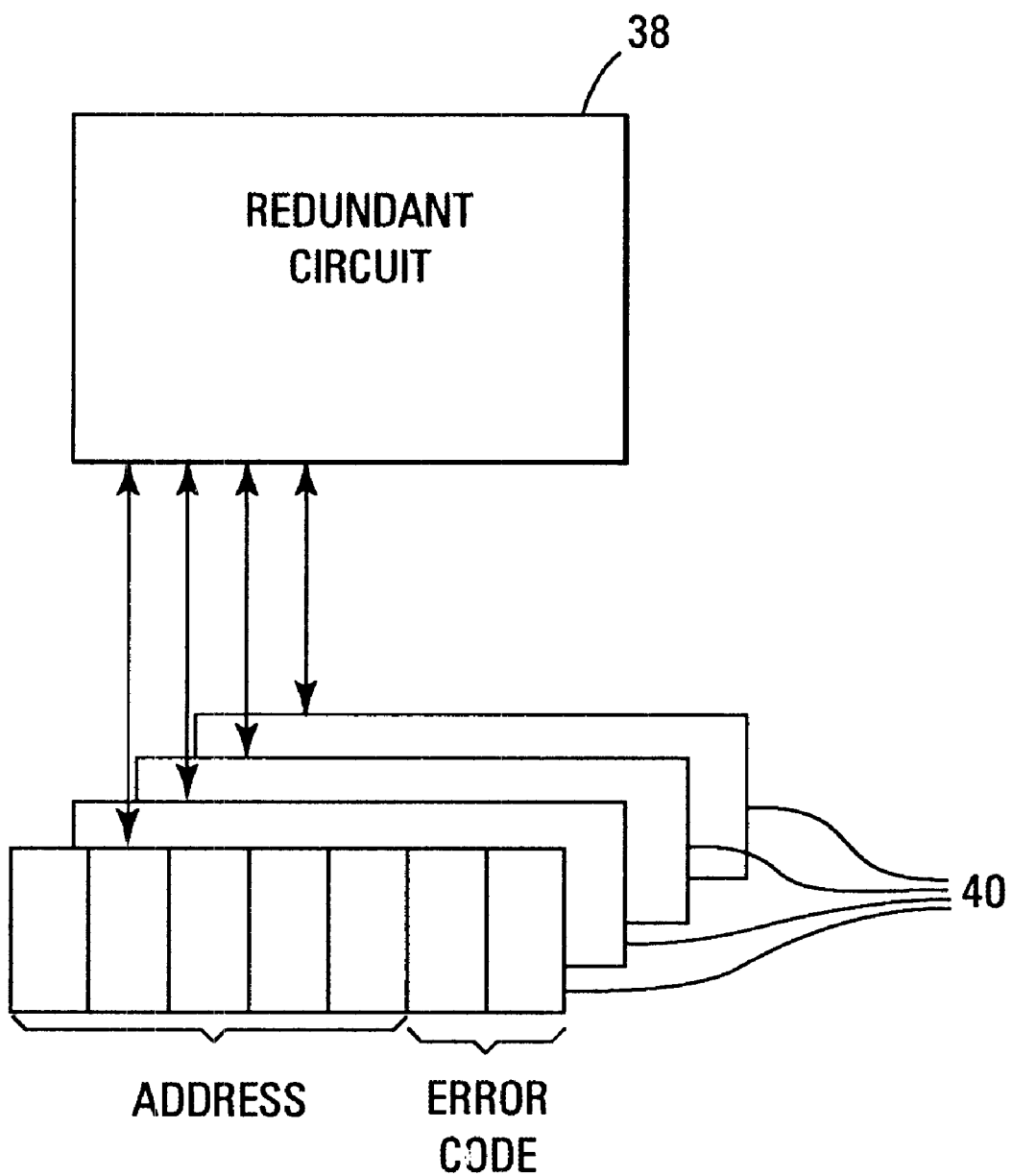
FIG. 2 is a block diagram illustrating the redundant circuit and registers of one embodiment of the present invention.

The redundant circuit 38 and the register 40 in one embodiment of the present invention are illustrated in FIG. 2. As illustrated, the register 40 stores an address of an associated redundancy element. The register 40 also has at least one extra memory cell or bit to store an error code. The error code designates the type of error the redundancy element is used to correct. That is, the error code describes the defect in the element in the primary array that is corrected by the redundancy element. FIG. 2 illustrates four registers 40. However, it will be recognized by those in the art, that the number of registers used will depend on the number of redundant elements used to repair defective elements in a primary memory array and the present invention is not limited to four registers.

In one embodiment of the present invention, when the redundant circuit 38 discovers an address request that matches an address of a redundant element in a register 40, the redundant circuit 38 relays the error code in the register 40 to the state machine 30. During an erase operation, the state machine 30 executes an erase operation algorithm that is specific to each error code. For example, if the error code indicates a row to row short, the algorithm disables the redundancy circuit from redirecting the address request to the redundancy rows during the pre-program cycle and the soft program cycle. Moreover, if the error code indicated an isolated error, like a bad memory cell or a broken column or row, the state machine 30 would conduct a typical erase operation algorithm.

Figure 3:
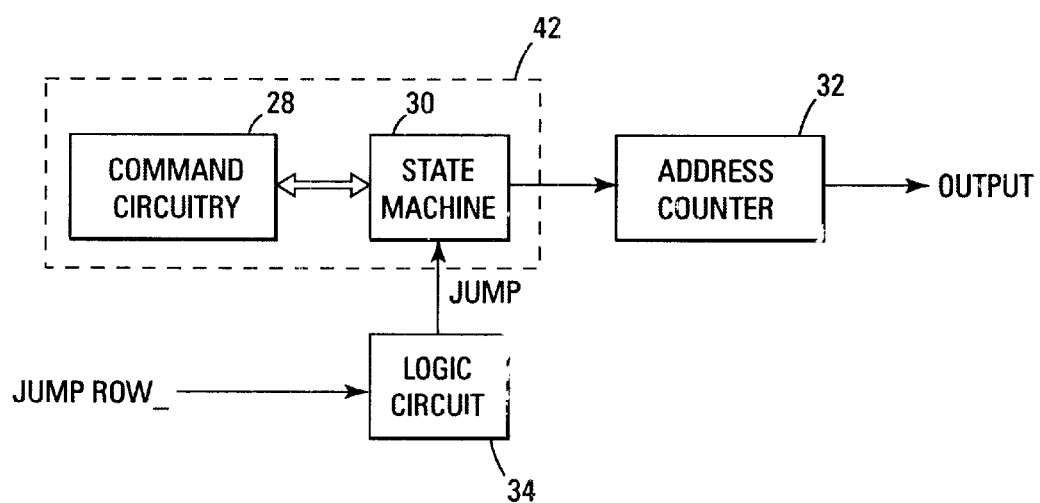
FIG. 3 is a block diagram illustrating the control circuitry, logic circuit and address counter of one embodiment of the present invention.

Moreover, in one embodiment of the present invention, when an error code indicates a row to row short, the redundant circuit 38 sends an enable or JumpRow__signal to the logic circuit 34, see FIG. 3. The logic circuit then sends a jump row or Jump-Row signal to the state machine 30, or control circuitry 42. The Jump-Row signal indicates that the state machine 30 should direct the address counter 32 to skip over the next row address after the respective pre-program pulse or soft program pulse is applied to the current row.

Figure 4:
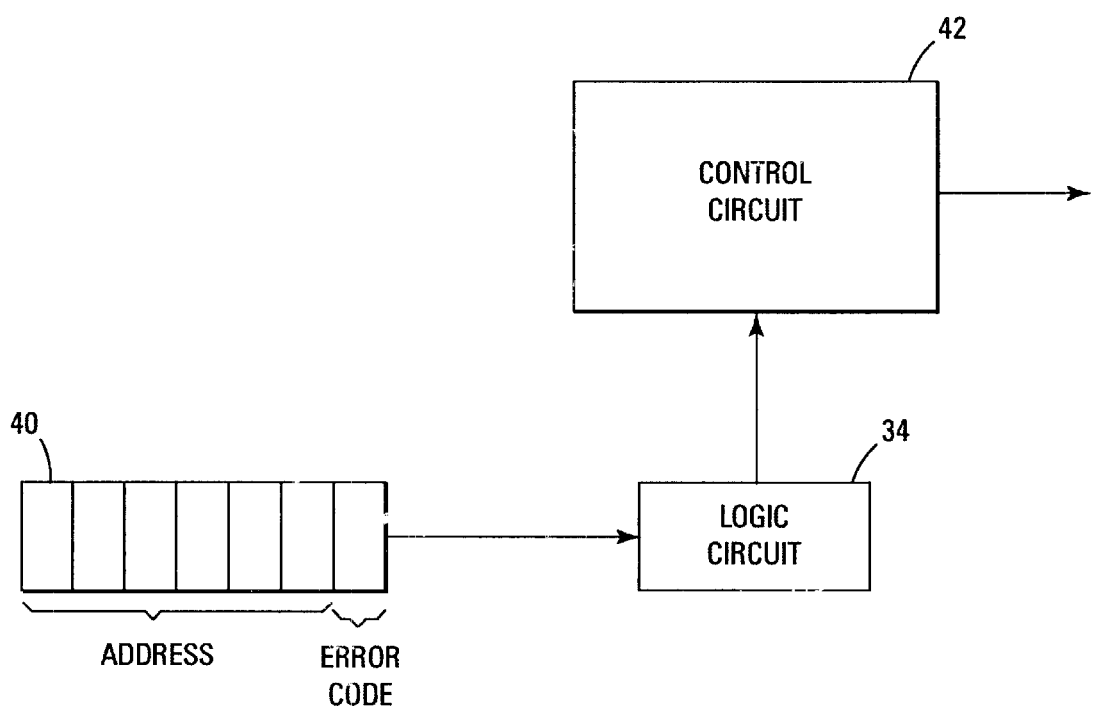
FIG. 4 a block diagram illustrating another embodiment of the control circuitry, logic circuit and address counter of the present invention.

In FIG. 2, the register 40 is shown as having two bits to store an error code. This allows four possible types of errors to be stored. It will be appreciated by those in the art that the number of bits can vary to change number of possible error types that can be stored and that the present invention is not limited to two bits. For example, in another embodiment, the register only provides one bit to store the error code. This is illustrated in FIG. 4. In this embodiment, the one bit indicates if the error is a row to row short or some other type of error. For example, a row to row short could be indicated by the one bit being in a low state and for other types of errors being in a high state. Therein, when the logic circuit knows it is dealing with a row to row short when a low state is received and it is not dealing with a row to row short when a high state is received. A redundant circuit is not needed to decode the error code, in this embodiment.

Figure 5:
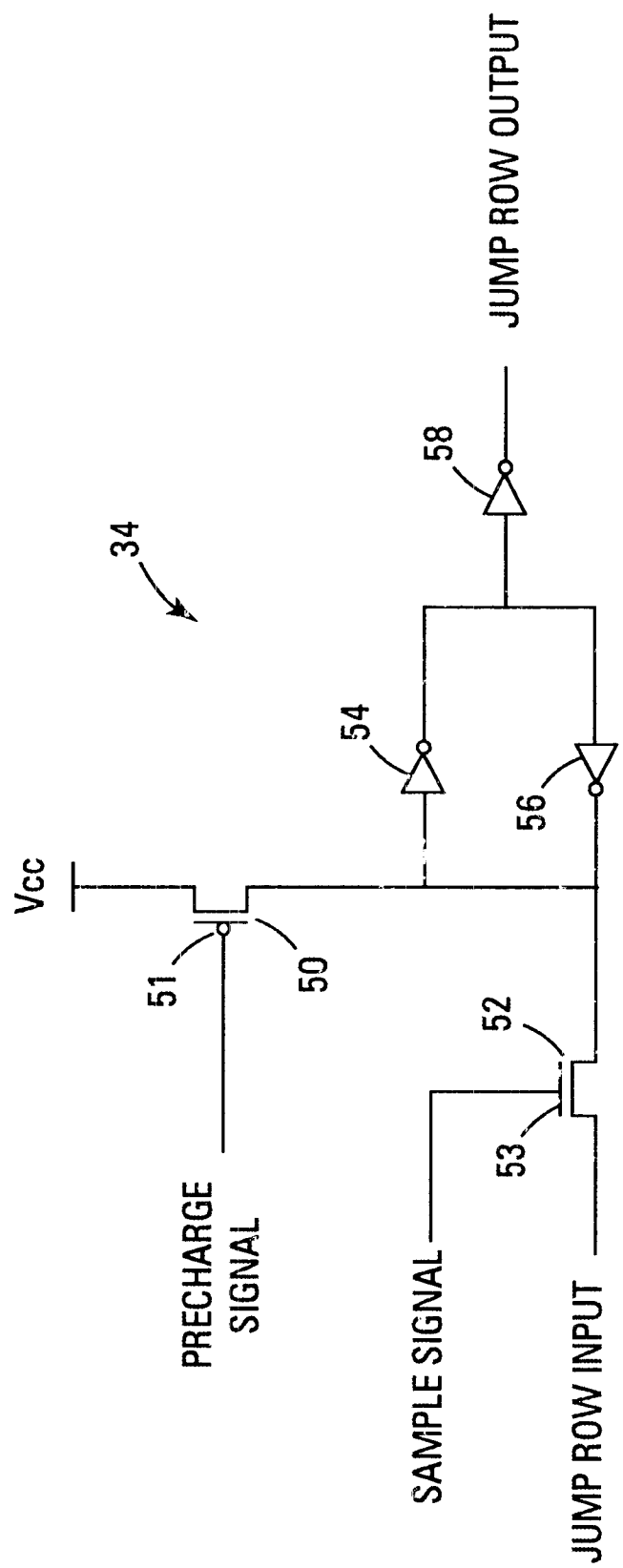
FIG. 5 is a schematic diagram illustrating one embodiment of the logic circuit.

One embodiment of the logic circuit 34 is illustrated in FIG. 5. As illustrated, the logic circuit 34 has a latch 60, a pre-charge circuit 62 and a sample circuit 64. The latch 60 has three inverters 54, 56, and 58. The output of inverter 58 is the output of the logic circuit 34 or the jump-row output. The pre-charge circuit 62 and the sample circuit 64 control input to the latch 60. The pre-charge circuit 62 has a pre-charge transistor 51. When the pre-charge transistor 50 is activated, a high output signal, generated by Vcc, is output. Applying a pre-charge signal to a control gate 51 of the pre-charge transistor 51 activates the pre-charge transistor. The pre-charge signal is applied when the row address is incremented. The sample circuit includes a jump-row transistor 52. Applying a sample signal to a control gate 53 of the jump-row transistor 52 activates the jump-row transistor 52. The sample signal is applied directly following the pre-charge signal. If an active low JumpRow__signal is present when the jump-row transistor 52 is activated, an active low Jump-Row signal is output from the logic circuit 34.

Figure 6:
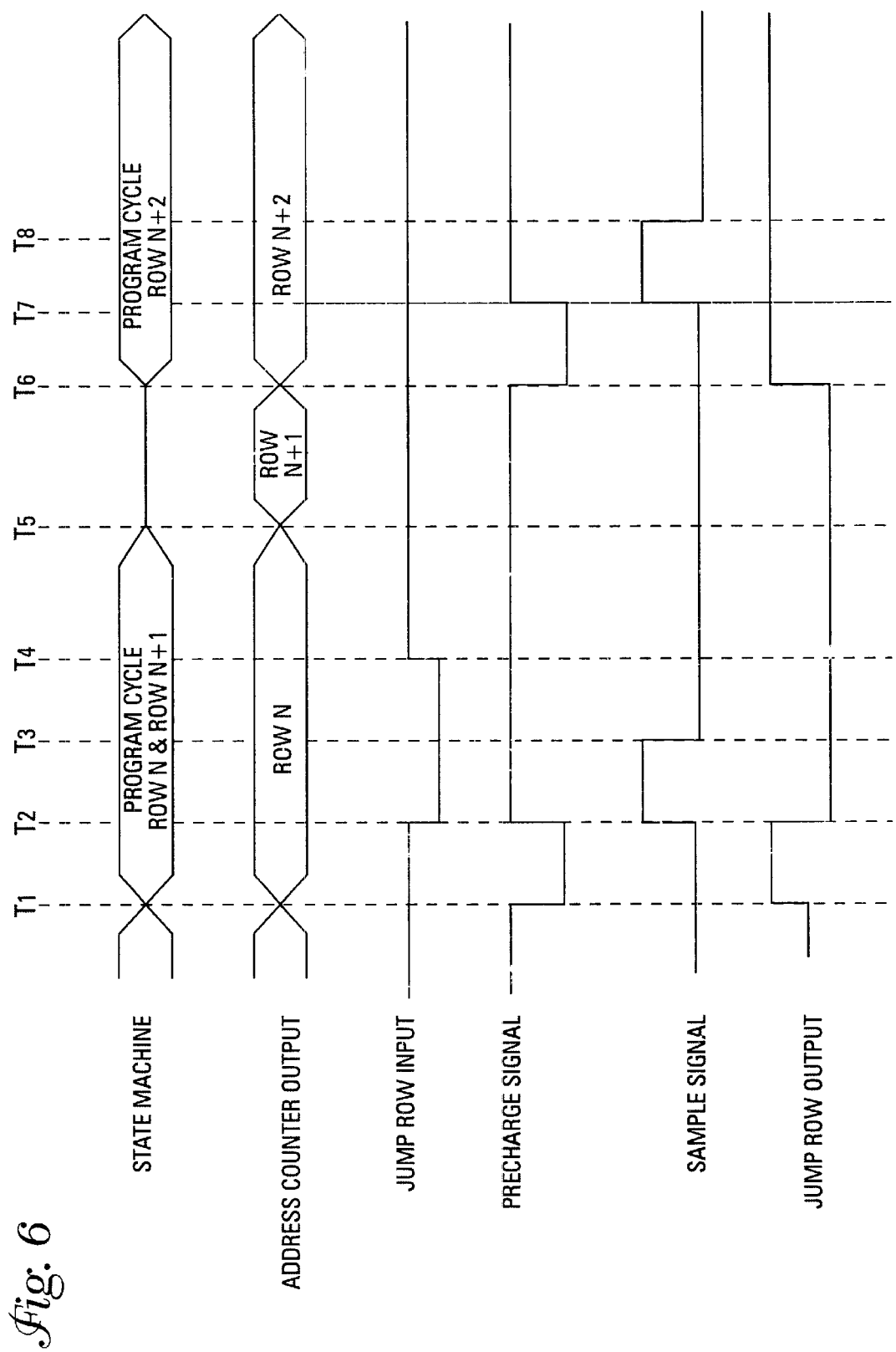
FIG. 6 is a chart illustrating the timing of the present invention.

A timing diagram illustrating the application of the present invention during a pre-program cycle or a soft program cycle on a pair of rows shorted together (row N and row N+1) is illustrated in FIG. 6. At time T1, a program cycle on row N and row N+1 is initiated. The state machine 30 sends the pre-charge signal to the control gate 51 of the pre-charge transistor 50. The jump-row output signal of the logic circuit 43 then goes to a high state. At time T2, the sample signal is applied to the control gate 53 of the jump-row transistor 52 which activates the jump-row transistor 52. If the redundancy circuit 38 matches the row address to a redundancy row address and the error code indicates a row to row short, logic circuit 34 receives a JumpRow__signal from the redundancy circuit 38. The jump-row output signal then goes a low state. The state machine 30 then directs the address counter 32 to increment the row address to row N+1 when the initial pre-program or soft program cycle is complete (T5), but prior to a typical address count (T6). The state machine 30 then directs the address counter 32 to increment the row address to N+2 at T6.

The pre-program or soft program cycle is then continued with row N+2. At the start of the pre-program or soft program cycle on row N+2 (T6), the state machine sends the pre-charge signal to the control gate 51 of the pre-charge transistor 50. The jump-row output of the logic circuit 34 then goes to a high state. The sample signal is then applied at T7 to the control gate 53 of the jump row transistor 52 thereby activating the jump row transistor 52. Since row N+2 is not shorted to another row, the JumpRow__ is not sent by the redundancy circuit 38 and the jump row output remains in a high state at T8.

CONCLUSION

A flash memory device incorporating redundant rows. The memory device includes a memory array, control circuitry and a register. The control circuitry controls operations to the memory array. The register stores an address of a defect in the memory array and data indicating a type of defect associated with the address. The control circuitry increments row addresses during an erase operation based on the type of defect stored in the register.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A flash memory device comprising:

a memory array;

a state machine to control operations to the memory array; and a defect register to store data indicating a type of defect, wherein the state machine increments row addresses during an erase operation based on the type of defect stored in the defect register.

2. The flash memory device of claim 1 wherein during the erase operation the state machine increments row addresses such that only one of two rows shorted together is addressed during a program cycle.

3. The flash memory device of claim 1 further comprising a logic circuit to selectively signal the state machine when the defect register is accessed that has a type of defect stored that indicates a row to row short.

4. The flash memory device of claim 1 further comprising a redundant circuit to decode the type of defect stored in the defect register.

5. A flash memory device comprising:
a memory array having memory cells arranged in rows and columns;
control circuitry to control memory operations;
at least one register to store an error code; and
a logic circuit to selectively signal a state machine when a register is accessed during an erase operation that has an error code that indicates a row to row short, wherein the state machine increments row addresses such that only one of two rows shorted together is addressed during a program cycle.

6. The flash memory device of claim 5 wherein the register stores an error code that is one bit.

7. The flash memory device of claim 5 wherein the register stores an error code that is more than one bit.

8. A flash memory device comprising:
a memory array having memory cells arranged in rows and columns;
control circuitry to control memory operations;
at least one register to store an error code;
a logic circuit to selectively signal the state machine when a register is accessed during an erase operation that has an error code that indicates a row to row short, wherein the state machine increments row addresses such that only one of two rows shorted together is addressed during a program cycle; and
wherein the logic circuit further comprises,
a latch having an output coupled to the state machine,
a pre-charge circuit coupled to an input to the latch, and
a sample circuit coupled between the logic circuit and an input of the latch.

9. A flash memory device comprising:
a memory array having primary columns and primary rows of memory cells, the memory array further having redundant rows;
a state machine to control memory operations;
a logic circuit to signal the state machine when a row in the primary array is addressed during a program cycle of an erase operation that is shorted to another row in the primary array;
a register for each redundant row to store an address of an associated defective primary row and an error code indicating the type of defect in the primary row; and
redundancy circuit to decode the error code and provide a signal to the logic circuit that a primary row has been addressed that has a row to row short; and
wherein the state machine increments row addresses such that only one of the two rows shorted together is addressed during the program cycle.

10. A flash memory device comprising:
a memory array having primary columns and primary rows of memory cells, the memory array further having redundant rows;
a state machine to control memory operations;
a logic circuit to signal the state machine when a row in the primary array is addressed during a program cycle of an erase operation that is shorted to another row in the primary array;
wherein the state machine increments row addresses such that only one of the two rows shorted together is addressed during the program cycle; and
wherein the logic circuit further comprises,
a latch having an output coupled to the state machine,
a pre-charge circuit coupled to an input to the latch to pre-charge the latch to a high state, and
a sample circuit coupled to an input of the latch to set the latch to an active low state when a row is addressed that is shorted to another row during a program cycle.

11. The flash memory device of claim 10 wherein the pre-charge circuit comprises a pre-charge transistor to selectively gate a Vcc signal to the latch, wherein the pre-charge transistor is activated by a pre-charge signal that is applied at the start of a program cycle on a row.

12. The flash memory device of claim 10 wherein the sample circuit comprises a jump row transistor to selectively gate the active low signal to the latch, wherein the jump row transistor is activated by a sample signal that is applied after the pre-charge circuit has set the latch to a high state, further wherein the active low signal is sent to the latch when a jump row signal is applied to the jump row transistor while the jump row transistor is activated.

13. A flash memory device comprising:
a memory array having memory cells arranged in primary rows and primary columns, the memory array further having multiple redundant rows to selectively replace defective primary rows;
a register for each redundant row to store an address of an associated defective primary row and an error code that indicates a type of defect in the associated defective primary row;
a redundancy circuit to compare address requests to addresses stored in the registers and to decode the error codes, wherein the redundancy circuit redirects address requests from defective primary rows to the redundant rows when an address request matches an address in a register;
a logic circuit coupled to the redundancy circuit to generate a signal in response to an error code in a register that indicates a primary row shorted to another primary row has been addressed; and
control circuitry to control memory operations to the memory array, wherein when the control circuitry receives the signal from the logic circuit, the control circuitry disables the redundancy circuit during a pre-program or soft program cycle of an erase operation, further wherein the control circuitry activates the primary rows shorted together and applies the respective pre-program or soft program cycle to the rows simultaneously and then increments the row address past the addresses of the shorted primary rows.

14. The flash memory device of claim 13 further comprising:
an address counter to increment the address of the memory array on direction of the control circuitry.

15. A flash memory device comprising:
a memory array having memory cells arranged in primary rows and primary columns, the memory array further having multiple redundant rows to selectively replace defective primary rows;

a register for each redundant row to store an address of an associated defective primary row and an error code that indicates a type of defect in the associated defective primary row;

a redundancy circuit to compare address requests to addresses stored in the registers and to decode the error codes, wherein the redundancy circuit redirects address requests from defective primary rows to the redundant rows when an address request matches an address in a register;

a logic circuit coupled to the redundancy circuit to generate a signal in response to an error code in a register that indicates a primary row shorted to another primary row has been addressed;

control circuitry to control memory operations to the memory array, wherein when the control circuitry receives the signal from the logic circuit, the control circuitry disables the redundancy circuit during a pre-program or soft program cycle of an erase operation, further wherein the control circuitry activates the primary rows shorted together and applies the respective pre-program or soft program cycle to the rows simultaneously and then increments the row address past the addresses of the shorted primary rows; and wherein the logic circuit further comprises,
a latch having an output coupled to the control circuitry,
a pre-charge circuit coupled to an input to the latch to pre-charge the latch to a high state at the start of a pre-program or soft program cycle, and
a sample circuit coupled to an input of the latch to set the latch to an active low state when a primary row is addressed that is shorted to another primary row during a pre-program or soft program cycle.

16. A flash memory device comprising:

a memory array having a primary array of memory cells arranged in rows and columns;

at least one redundant element to selectively replace an associated defective element in the primary array;

a register for each redundant element to store an address of the associated defective element and an error code that indicates the type of defect in the defective element;

a redundancy circuit to compare address requests with addresses stored in the registers and to decode the error code in the associated register, wherein the redundancy circuit redirects address requests from the defective element to the redundant element;

a state machine to control memory operations, wherein the state machine disables the redundancy circuit during a program cycle of an erase operation when the redundancy circuit matches the address request to an address in a register and the error code in the register indicates a row to row short;

a logic circuit coupled to the redundancy circuit to supply a signal to the state machine in response to the error code indicating a row to row short; and wherein the state machine increments row addresses such that only one of two rows shorted together is addressed during a program cycle in response to receiving the signal from the logic circuit.

17. The memory device of claim 16 wherein the redundant elements are redundant rows.

18. The flash memory device of claim 16 wherein the memory array includes defective row N that is shorted to defective row N+1.

19. The flash memory device of claim 18 wherein row N and row N+1 are both activated and a pre-program pulse of a program cycle is applied to row N and row N+1 simultaneously.

20. The flash memory device of claim 18 wherein row N and row N+1 are both activated and a soft program pulse of a program cycle is applied to row N and row N+1 simultaneously.

21. A flash memory system comprising:

a processor to provide data;

a memory array arranged in rows and columns to store the data;

at least one redundant row to selectively replace an associated defective row in the memory array;

a register for each redundant row to store an address of the associated defective row in the memory array and an error code that indicates the type of error the redundant row is used to correct;

a redundancy circuit to compare row address requests to redundancy row addresses and redirect address requests from the defective row to the redundant row;

a logic circuit to generate a signal when the redundancy circuit matches an address request to an address in a register during a program cycle and the error code in the register indicates a row has been addressed that has a row to row short; and control circuitry to control memory operations, wherein the control circuitry disables the redundancy circuit from redirecting address requests when the signal is received from the logic circuit, the control circuitry further directing an address counter to increment the row address past the rows shorted together upon completion of the program cycle on the rows shorted together.

22. The flash memory system of claim 21 further wherein the control circuitry activates both rows shorted together and applies the program cycle to both rows simultaneously.

23. A flash memory system comprising:

a processor to provide data;

a memory array arranged in rows and columns to store the data;

at least one redundant row to selectively replace an associated defective row in the memory array;

a register for each redundant row to store an address of the associated defective row in the memory array and an error code that indicates the type of error the redundant row is used to correct;

a redundancy circuit to compare row address requests to redundancy row addresses and redirect address requests from the defective row to the redundant row;

a logic circuit to generate a signal when the redundancy circuit matches an address request to an address in a register during a program cycle and the error code in the register indicates a row has been addressed that has a row to row short;

control circuitry to control memory operations, wherein the control circuitry disables the redundancy circuit from redirecting address requests when the signal is received from the logic circuit, the control circuitry further directing an address counter to increment the row address past the rows shorted together upon completion of the program cycle on the rows shorted together; and wherein the logic circuit further comprises,
   a latch having an output coupled to the control circuitry,
   a pre-charge circuit coupled to an input to the latch to pre-charge the latch to a high state at the start of program cycle, and
   a sample circuit coupled to an input of the latch to set the latch to an active low state when the error code indicates a row has been addressed that is shorted to another row during a program cycle.

24. A method of operating a flash memory system comprising:
   performing a program cycle on a memory array having memory cells arranged in rows and columns;
   comparing address requests with addresses in registers that store addresses of defective elements in the memory array;
   matching a row address request with a row address in a register;
   reading an error code in the register that indicates the address is associated with a row to row short in the memory array;
   signaling a state machine that a row shorted to another row has been addressed;
   activating rows shorted together;
   applying program pulses to memory cells coupled to the shorted rows simultaneously; and
   incrementing a row address beyond the rows shorted together upon completion of the program cycle on the shorted rows.

25. A method of operating a flash memory system comprising:
   performing a program cycle on a memory array having memory cells arranged in rows and columns;
   signaling a state machine when a row shorted to another row has been addressed;
      wherein signaling the state machine a row shorted to another row further comprises,
         comparing address requests with addresses in registers that store addresses of defective elements in the memory array,
         matching a row address request with a row address in a register,
         reading an error code in the register that indicates the address is associated with a row to row short in the memory array, and
         generating a signal that indicates a row has been addressed that has a row to row short;
      wherein the generating of the signal that indicates a row has been addresses that has a row to row short further comprises,
         presetting a latch output signal high at the start of program cycle on a row,
         activating a sample circuit after the output signal is set high,
         applying an active low enable signal to the sample circuit in response to the error code indicating a row to row short, and
         setting the latch output to an active low signal;
   activating rows shorted together;
   applying program pulses to memory cells coupled to the shorted rows simultaneously; and
   incrementing a row address beyond the rows shorted together upon completion of the program cycle on the shorted rows.

26. A method of operating a memory system comprising:
   performing a pre-program or soft program cycle on a memory array;
   pre-setting an output signal of a logic circuit high;
   comparing row addresses with addresses in registers;
   matching a row address with an address in the register;
   reading an error code in the register that indicates a row to row short;
   setting an output signal of the logic circuit to an active low;
   applying the respective pre-program or soft program cycle on the rows shorted together simultaneously; and
   incrementing the row address so that the respective pre-program or soft program cycle is only applied once simultaneously to the rows shorted together.

27. A method of operating a flash memory during a pre-program cycle comprising:
   applying a pre-program pulse to rows in a memory array incrementally until a row address matches an address in a register and an error code in the register indicates the row at that address is shorted to another row;
   activating the rows shorted together;
   applying a pre-program pulse to memory cells coupled to the rows shorted together simultaneously as the columns are incremented;
   incrementing the row address past the rows shorted together; and
   applying a pre-program pulse to remaining rows in the memory array incrementally.

28. A method of operating a flash memory during a pre-program cycle comprising:
   applying a pre-program pulse to rows in a memory array incrementally until a row address matches an address in a register and an error code in the register indicates the row at that address is shorted to another row;
   activating the rows shorted together;
   applying a pre-program pulse to memory cells coupled to the rows shorted together simultaneously as the columns are incremented;
   incrementing the row address past the rows shorted together;
      wherein incrementing the row address past the rows shorted together comprises,
         generating an enable signal with a redundancy circuit based on the error code indicating a row to row short,
         processing the enable signal with a logic circuit to produce a jump row signal at the start of the pre-program cycle on the rows shorted together, and
         sending the jump row signal to control circuitry, wherein the control circuitry directs an address counter to increment the row address to a following row address beyond the addresses of the rows shorted together after the pre-program cycle has been completed on the rows shorted together; and
   applying a pre-program pulse to remaining rows in the memory array incrementally.

29. A method of operating a flash memory during a soft-program cycle comprising:
   monitoring each column for a current level that would indicate a memory cell is coupled to the column that is over-erased;
   when a column is discovered that has a current level that would indicate an over-erased cell is coupled to the column, applying a soft program pulse to rows coupled to the column incrementally until the current level no longer indicates an over-erased memory cell is coupled to the column or a row address matches an address in a register and an error code in the register indicates the row is shorted to another row;

when a row is addressed that is shorted to another row, activating the shorted rows, applying a soft program pulse to cells coupled to the rows shorted together simultaneously;

verifying if a current level in the column still indicates a memory cell is coupled to the column;

when a current level still indicates the memory cell is coupled to the column, incrementing the row address past the rows shorted together; and applying a soft program pulse to remaining rows in the memory array until the current level no longer indicates an over-erased memory cell is coupled to the column.

30. The method of claim 29 wherein incrementing the row address past the rows shorted together further comprises:

generating an enable signal with a redundancy circuit based on the error code indicating a row to row short;

processing the enable signal with a logic circuit to produce a jump row signal when the soft program cycle is being applied to the rows shorted together; and sending the jump row signal to control circuitry, wherein the control circuitry directs an address counter to increment the row address to a following row address beyond the addresses of the rows shorted together after the soft program cycle has been completed on the rows shorted together.

31. The method of claim 30 wherein the rows shorted together are row N and row N+1 and the following row address is row N+2.

32. A method of operating a flash memory system comprising:

applying a program cycle to rows in a memory array incrementally until a row address matches a redundancy row address stored in a register;

reading an error code in the register indicating the row addressed is shorted to another row;

disabling the redundancy circuit from redirecting the address request to a redundancy row;

activating the current row and the following row simultaneously;

applying the program cycle to the shorted rows simultaneously;

sending an enable signal from a redundancy circuit to a logic circuit indicating the error code was row to row short;

sending a jump row signal from the logic circuit to a state machine during the program cycle on the shorted rows;

incrementing the row address beyond the shorted rows, wherein the state machine increments the row address based on the jump row signal sent by the logic circuit after the program cycle has been completed on the shorted rows; and applying the program cycle to remaining rows in the memory array incrementally.

33. The method of claim 32 wherein incrementing the row address beyond the shorted rows comprises:

incrementing the row address upon completion of the program cycle on the shorted rows; and incrementing the row address once more before the program cycle is applied to the next row.

34. A method of operating a flash memory system having a memory array with a row N shorted to a row N+1 comprising:

performing a pre-program or heal program cycle of an erase operation on rows of the memory array incrementally;

addressing row N;

signaling a state machine that row N is shorted to row N+1;

activating row N and row N+1;

applying a pre-program or heal program cycle to row N and row N+1 simultaneously;

incrementing the row address twice after the pre-program or heal program cycle has been completed on row N and row N+1 and before the pre-program or heal program cycle is applied on a following row; and performing a pre-program or heal program cycle of an erase operation on the remaining rows of the memory array incrementally.

35. The method of claim 34 wherein signaling the state machine that row N is shorted to row N+1 further comprises:

matching the row address of row N with a row address stored in a register;

reading an error code in the register that indicates row N is shorted to another row; and generating a jump row signal in response to the error code.

36. A method of operating a memory system having a memory array with a row (row N) shorted to another row (row N+1) during a pre-program or soft program cycle comprising:

addressing row N;

reading an error code stored in a register that indicates row N is shorted to row N+1 with a redundancy circuit;

disabling the redundancy circuit from pointing the address request from row N to a redundant row;

activating row N and row N+1;

performing the pre-program or soft program cycle on row N and row N+1 at the same time; and incrementing an address counter to row N+2.

37. The method of claim 36 wherein incrementing the address counter to row N+2 further comprises:

generating an enable signal with a redundancy circuit based on the error code indicating a row to row short;

processing the enable signal with a logic circuit to produce a jump row signal when the pre-program or soft program cycle is being applied to row N and row N+1; and sending the jump row signal to control circuitry, wherein the control circuitry directs an address counter to increment the row address to row N+2 based on the jump row signal, further wherein the control signal increments the address counter to row N+2 after the pre-program cycle or soft program cycle has been completed on the rows shorted together.

* * * * *